United States Patent
Pionetti et al.

(10) Patent No.: US 10,704,727 B2
(45) Date of Patent: Jul. 7, 2020

(54) ELECTRICAL INSTALLATION FOR AN ELECTRIC TRACE HEATING SYSTEM FOR A METAL PIPE FOR TRANSPORTING FLUIDS AND ELECTRIC TRACE HEATING METHOD FOR SUCH A PIPE

(71) Applicant: SAIPEM S.A., Montigny le Bretonneux (FR)

(72) Inventors: François-Régis Pionetti, La Baleine (FR); Jalil Agoumi, Le Kremlin-Bicetre (FR); Axel Sundermann, Fontenay-les-Briis (FR)

(73) Assignee: Saipem S.A., Montigny le Bretonneux (FR)

(*) Notice: Subject to any disclaimer, the term of this patent is extended or adjusted under 35 U.S.C. 154(b) by 65 days.

(21) Appl. No.: 16/094,746

(22) PCT Filed: Feb. 7, 2017

(86) PCT No.: PCT/FR2017/050270
§ 371 (c)(1),
(2) Date: Oct. 18, 2018

(87) PCT Pub. No.: WO2017/182721
PCT Pub. Date: Oct. 26, 2017

(65) Prior Publication Data
US 2019/0128461 A1 May 2, 2019

(30) Foreign Application Priority Data
Apr. 18, 2016 (FR) ...................... 16 53388

(51) Int. Cl.
*F16L 53/38* (2018.01)
*H05B 1/02* (2006.01)
(Continued)

(52) U.S. Cl.
CPC ............... *F16L 53/38* (2018.01); *F17D 1/18* (2013.01); *G01R 31/083* (2013.01);
(Continued)

(58) Field of Classification Search
CPC ..... F16L 53/38; G01R 31/083; H05B 1/0244; H05B 3/56; H05B 2203/021; H05B 2214/03
(Continued)

(56) References Cited

U.S. PATENT DOCUMENTS 2,431,383 A * 11/1947 Finch ...................... H02M 7/06
315/97
2,757,739 A * 8/1956 Douglas .................. E21B 36/04
166/61
(Continued)

FOREIGN PATENT DOCUMENTS

FR 2 978 006 1/2013
FR 2 991 024 11/2013
(Continued)

*Primary Examiner* — Craig M Schneider
*Assistant Examiner* — David R Deal
(74) *Attorney, Agent, or Firm* — Cozen O'Connor

(57) ABSTRACT

An electrical installation for an electrical system for trace heating a fluid transport pipe (8) made of metal, at least one polyphase circuit having three main electric cables (6-1, 6-4, and 6-7) in a star connection, and one additional electric cable (6-2, 6-3, 6-5, 6-6, 6-8, and 6-9), the main cables and the additional cable positioned around the pipe and connected at the pipeline end to a common connection ring (10) forming a point of zero electric potential, and detector for detecting a failure, if any, of the polyphase circuit to identify a failed main cable in order to replace it with the additional cable.

13 Claims, 4 Drawing Sheets

(51) Int. Cl.
*H05B 3/56* (2006.01)
*F17D 1/18* (2006.01)
*G01R 31/08* (2020.01)

(52) U.S. Cl.
CPC ............. *H05B 1/0244* (2013.01); *H05B 3/56* (2013.01); *H05B 2203/021* (2013.01); *H05B 2214/03* (2013.01)

(58) Field of Classification Search
USPC .......................................................... 138/38
See application file for complete search history.

(56) References Cited

U.S. PATENT DOCUMENTS

| | | | | |
|---|---|---|---|---|
| 5,172,765 | A * | 12/1992 | Sas-Jaworsky | E21B 17/206 166/384 |
| 7,820,945 | B2 * | 10/2010 | Seo | H05B 3/12 219/212 |
| 8,985,154 | B2 * | 3/2015 | Quigley | F16L 11/12 138/33 |
| 10,165,626 | B2 * | 12/2018 | Kim | H05B 3/58 |
| 2014/0238523 | A1 * | 8/2014 | Wortmann | F24S 40/00 138/33 |
| 2015/0312963 | A1 * | 10/2015 | Kiernan | H05B 3/04 219/483 |
| 2016/0233757 | A1 * | 8/2016 | Meausoone | H02M 5/2576 |
| 2016/0316518 | A1 * | 10/2016 | Lewandowski | F24H 1/105 |
| 2018/0252345 | A1 * | 9/2018 | Hackel | E03B 7/12 |
| 2018/0363824 | A1 * | 12/2018 | Weissing | F01N 3/2066 |
| 2019/0323643 | A1 * | 10/2019 | Stahl | H05B 3/42 |

FOREIGN PATENT DOCUMENTS

| | | |
|---|---|---|
| GB | 2 485 647 | 5/2012 |
| GB | 2 492 883 | 1/2013 |
| WO | WO 88/05988 | 8/1988 |

* cited by examiner

ELECTRICAL INSTALLATION FOR AN ELECTRIC TRACE HEATING SYSTEM FOR A METAL PIPE FOR TRANSPORTING FLUIDS AND ELECTRIC TRACE HEATING METHOD FOR SUCH A PIPE

PRIORITY CLAIM

This is a U.S. national stage of application No. PCT/FR2017/050270, filed on Feb. 7, 2017. Priority is claimed on France Application No. FR1653388, filed Apr. 18, 2016, the content of which is incorporated herein by reference.

BACKGROUND OF THE INVENTION

The present invention relates to the general field of electrically trace-heating metal pipes for transporting fluids, and it relates in particular to undersea pipes resting on the sea bottom and providing a connection from undersea wells for producing hydrocarbons, in particular oil and gas, to a surface installation for storage and offloading, e.g. a floating production unit.

In a single offshore hydrocarbon production field, it is common to operate a plurality of wells that may be spaced apart from one another by several kilometers, or even tens of kilometers. The fluids coming from those various wells need to be collected by undersea pipes made of metal (typically steel) laid on the sea bottom, and then transferred by bottom-to-surface connection pipes ("risers") to a surface installation, e.g. a vessel or a collection point on land, that serves to collect the fluids in order to store them (and optionally process them).

The fluids coming from production wells tend to cool down very quickly while running along the numerous kilometers of undersea pipes. Unfortunately, if no provision is made for conserving some minimum threshold temperature inside such pipes, there is a major risk of molecules of gas, in particular of methane, that are contained in the fluids being transported combining at low temperature with molecules of water so as to form hydrate crystals. Such crystals can stick to the walls, where they agglomerate and contribute to forming plugs that are capable of blocking fluid flow inside pipes. Likewise, the oil solubility of high molecular weight compounds, such as paraffins or asphaltenes, decreases with lowering temperature, thereby giving rise to solid deposits that can also block flow.

One of the known solutions for attempting to remedy this problem consists in heating pipes by means of round or flat electric cables that are wound around steel pipes over their entire length in order to heat such pipes by the Joule effect. The electrical power that is supplied to the electric cables comes from an external electricity generator connected to the cables by an umbilical, or from an electricity generator that is integrated directly in the undersea pipes. That solution for electric heating is referred to as "heat-tracing" and serves to keep the fluids transported in the pipes at a temperature higher than a critical threshold over the entire path from the production well to the surface installation.

Typically, the electrical installation used for performing heat-tracing is made up of one or more three-phase electric circuits powered at different powers by one or more electrical transformers. Specifically, three-phase circuits are well adapted to delivering the electrical power needed for heating the pipe over its entire length with the lowest possible line losses.

In order to counter a failure, if any, of the electrical installation, leading to the heating of the undersea pipe being interrupted while it is in use, it is known to have recourse to redundant three-phase electric circuits in the installation, where such redundancy may be as much as 200% (i.e. two spare three-phase circuits are provided in addition to each three-phase circuit in use). When one of the three-phase circuits of the electrical installation fails, it is then replaced with one of the spare circuits. However, even though the failure of a three-phase circuit is generally due to the failure of only one of its electric cables, the circuit in question is scrapped entirely, including its electric cables that have not failed.

OBJECT AND SUMMARY OF THE INVENTION

A main object of the present invention is thus to mitigate such drawbacks by proposing an electrical installation that makes it possible to obtain redundancy of the three-phase electric circuits while limiting the number of electric cables in the installation.

In accordance with the invention, this object is achieved by an electrical installation for an electrical system for trace heating a fluid transport pipe made of metal, the installation comprising at least one polyphase electric circuit having:

at least three main electric cables in a star connection for conveying electric currents having the same frequency, the same amplitude, and different phases;

at least one additional electric cable distinct from the main cables, the main cables and the additional cable of the polyphase circuit being for positioning around the pipe between two longitudinal ends thereof, and being connected at the pipeline end to a common connection ring arranged around the pipe and forming a point of zero electric potential; and detection means for detecting a failure, if any, of the polyphase circuit in order to identify the failed main cable that has given rise to the failure of the polyphase circuit and in order to replace it with the additional cable.

When a failure in the polyphase circuit of the installation of the invention is detected, provision is made to identify the failed main cable that has given rise to the failure of the polyphase circuit, and to replace it with the additional cable. Thus, in the event of one of the main cables of the polyphase circuit failing and causing the polyphase circuit to fail, in the invention it is only the failed main cable that is disconnected from the circuit and replaced with the additional cable of the circuit. This replacement is made possible in particular because of the main cables and the additional cable being connected together at the pipeline end to the same zero electric potential (i.e. the connection ring arranged around the pipe). As a result, in the event of a failure of a polyphase circuit, since only the failed electric cable is replaced, it is possible to avoid pointlessly scrapping electric cables that have not failed.

In particular, if the polyphase circuit is a three-phase circuit (i.e. having three main cables powered by currents at mutual phase angles of one third of a turn), a single additional cable suffices to provide the circuit with 100% redundancy (two additional cables would serve to obtain 200% redundancy, etc.). Compared with the prior art in which 100% redundancy is obtained by adding a complete additional three-phase circuit, the invention thus makes it possible to reduce to one-third the number of additional electric cables needed for achieving the same redundancy. Conversely, with a complete additional three-phase circuit, the invention makes it possible to obtain redundancy of 300% (instead of only 100% redundancy with the prior art).

The additional cable of the polyphase circuit may be connected to a neutral connection of said polyphase circuit, with the means for detecting a failure, if any, of the polyphase circuit then comprising means for monitoring the magnitude of the electric current flowing in the additional cable connected to the neutral connection of the polyphase circuit. When the polyphase circuit is balanced (i.e. when the currents flowing in the main cables of the circuit have the same amplitude), the electric current flowing in the neutral of the circuit is practically zero (and less than 1% of the current flowing via the main cables). This solution thus presents the advantage of being able to detect a failure, if any, of the polyphase circuit by monitoring only the magnitude of the current flowing in this additional cable: in the event of the polyphase circuit failing, the magnitude of the current flowing in an additional cable will increase substantially.

Alternatively, the additional cable of the polyphase circuit may be a spare cable that is electrically disconnected from the polyphase circuit.

Regardless of how the additional cable is connected, the means for detecting a failure, if any, of the polyphase circuit may comprise means for monitoring the magnitude of the electric current flowing in each of the main cables of the polyphase circuit. As soon as a change in the magnitude of the current flowing in a main cable is detected (either because the magnitude goes to zero, or else because it becomes abnormally high), the main cable in question is considered as having failed and the operator switches off the polyphase circuit, disconnects the failed main cable, and replaces it with the additional cable.

The connection ring may be electrically connected to the pipeline end of the pipe. Under such circumstances, the connection ring may include a plurality of tongues in electrical contact with the pipe, the installation further comprising an annular clamping band for clamping the tongues against said pipe. Alternatively, the pipe may be electrically connected to a neutral connection of the polyphase circuit.

Preferably, the polyphase circuit is a balanced three-phase circuit in a star connection.

The invention also provides a system for electrically heating a fluid transport pipe made of metal, the system comprising an electrical installation as defined above and at least one electricity generator for electrically powering the main cables of the polyphase circuit.

The invention also provides a method of electrically trace heating a fluid transport pipe made of metal, the method comprising:

positioning around the pipe between two longitudinal ends thereof at least three main electric cables that are star connected to form a polyphase circuit, and also at least one additional electric cable;

coupling the main cables at the pipeline head to an electricity generator;

coupling the main cables and the additional cable at the pipeline end to a common connection ring arranged around the pipe and forming a point of zero electric potential; and detecting any failure of the polyphase circuit in order to identify the failed main cable that has given rise to the failure of the polyphase circuit, and, where appropriate, replacing the failed main cable with the additional cable.

BRIEF DESCRIPTION OF THE DRAWINGS

Other characteristics and advantages of the present invention appear from the following description made with reference to the accompanying drawings, which show an embodiment having no limiting character. In the figures.

DETAILED DESCRIPTION OF THE INVENTION

The invention applies to trace-heating any undersea or on-land metal pipe for transporting fluids, and in particular for electrically trace-heating steel undersea pipes resting on the sea bottom and providing transport between undersea wells producing hydrocarbons, in particular oil and gas, and a surface installation.

Figure 1:
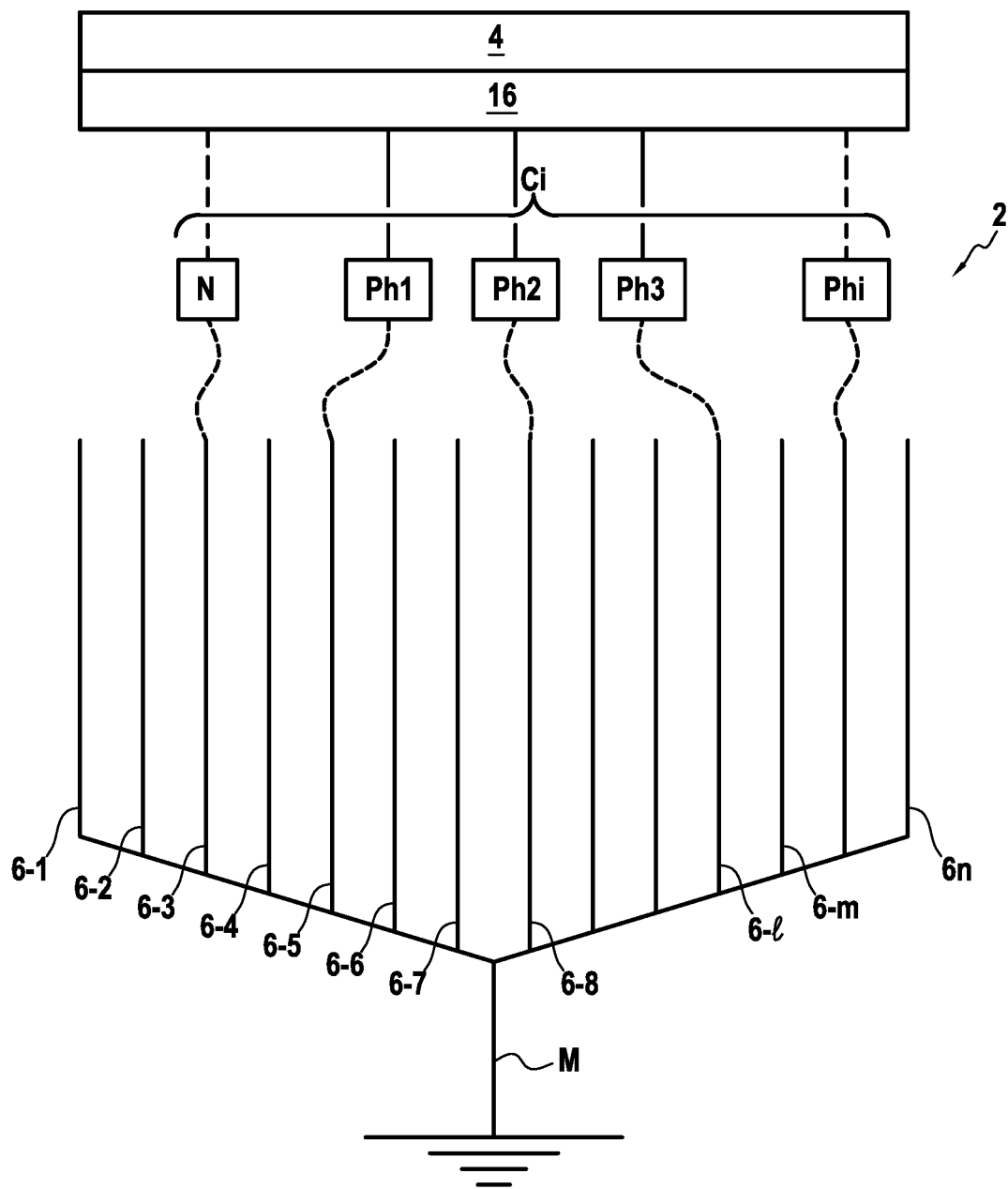
FIG. 1 shows in a highly diagrammatic manner an example installation for a heat-tracing system of the invention.
Figure 2:
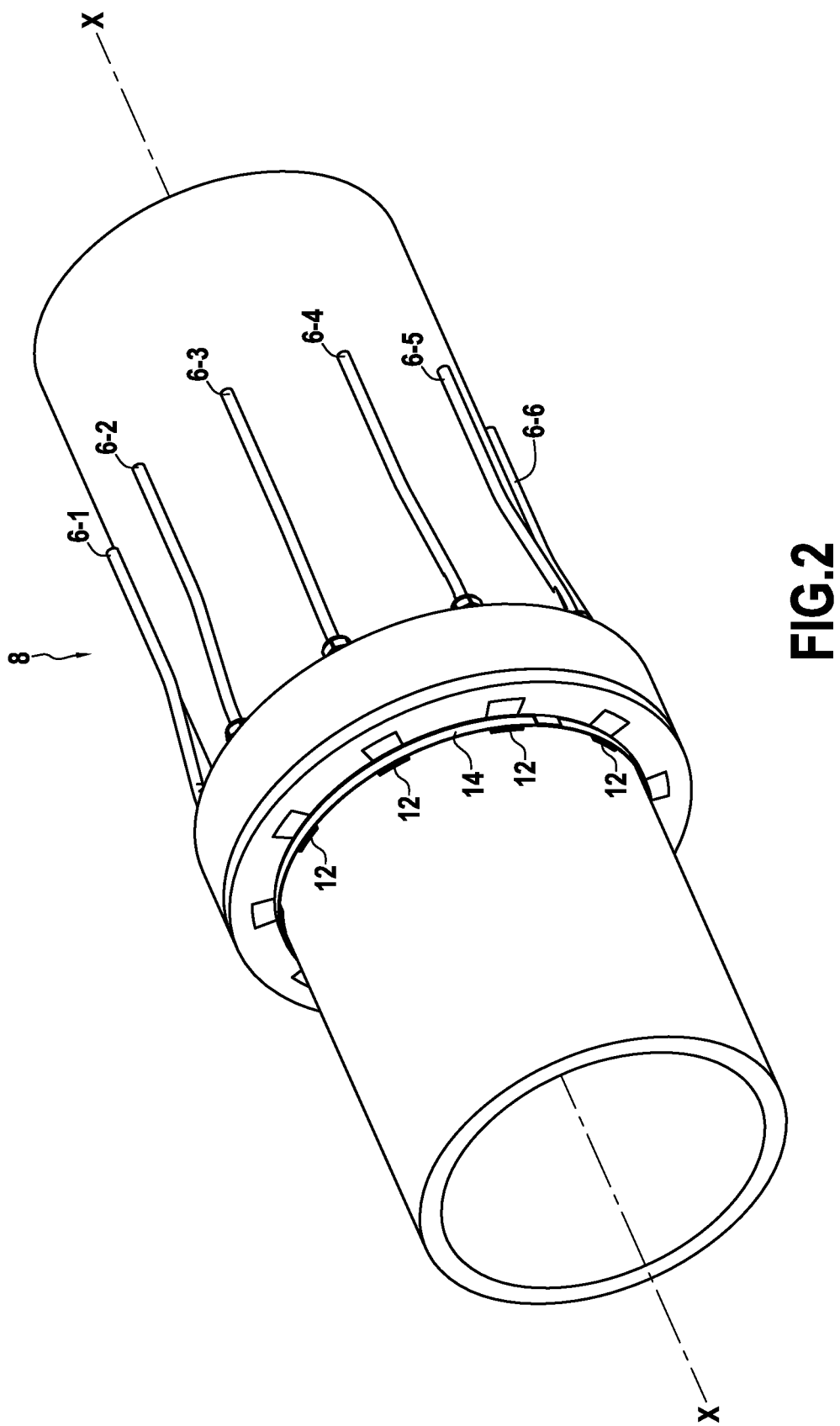
FIG. 2 is a fragmentary perspective view of a pipe fitted with an electrical installation of the invention.
Figure 3:
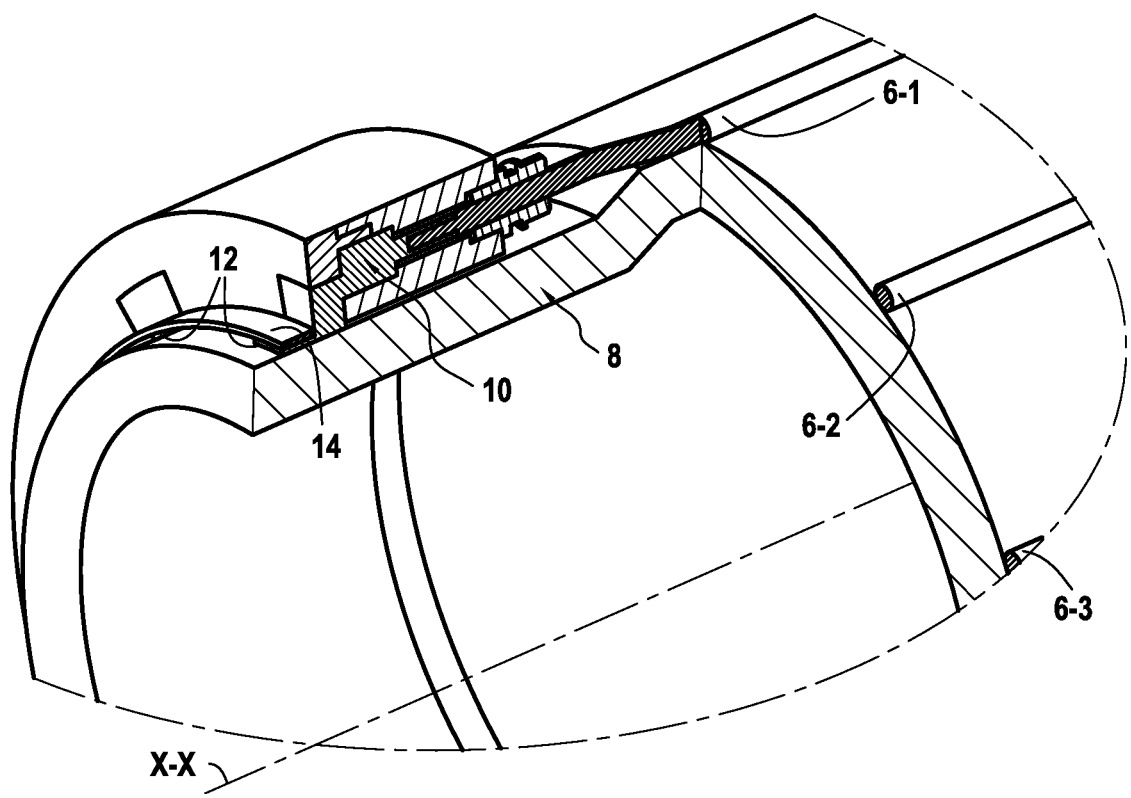
FIG. 3 is a section view of FIG. 2 showing more precisely the pipeline end connection of a cable to the connection ring of the electrical installation.
Figure 4:
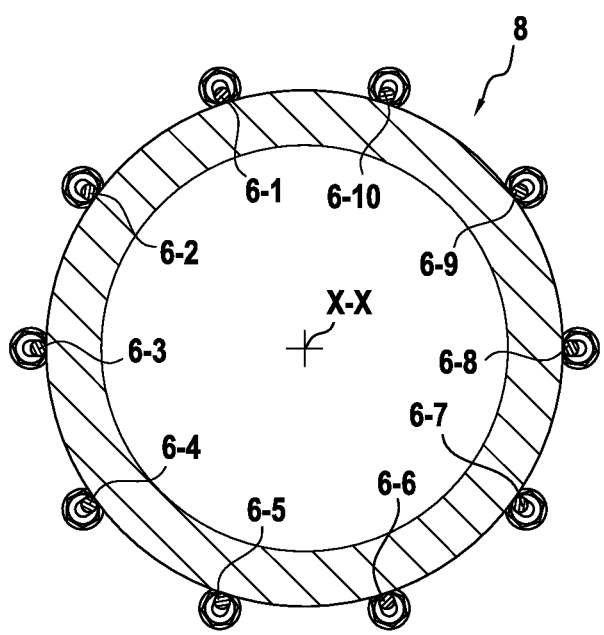
FIG. 4 is a cross-section view of the FIG. 2 pipe.

Heat-tracing a fluid transport metal pipe consists in using an electrical installation of the kind shown in a highly diagrammatic manner in FIG. 1, the electrical installation 2 comprising one or more polyphase electric circuits $C_j$ that are electrically powered from one or more electricity generators 4.

According to the invention, the electrical installation of the electrical system for trace heating the pipe comprises, for each polyphase electric circuit $C_j$, n electric cables 6-1, 6-2, ..., 6-n, where n is an integer greater than or equal to p+1, with p corresponding to the number of phases of the circuit $C_j$ (p being not less than 3). These n electric cables are positioned around the fluid transport pipe between its two longitudinal ends.

Among these n electric cables 6-1, 6-2, ..., 6-n, some are connected at the pipeline head to the electricity generator 4 in order to form the various phases Ph1, Ph2, Ph3, ..., Phi of the polyphase circuit $C_j$.

Herein, those electric cables that are connected at the pipeline head to the electricity generator in order to form the phases of the polyphase circuit (i.e. the cables 6-5, 6-8, 6-l, and 6-m in the FIG. 1 example) are referred to as "main" cables, while the other cables are referred to as "additional" cables.

One or more electric cables from among the additional electric cables may be connected to neutral if the electricity generator 4 has a neutral connection. Thus, in the example shown in FIG. 1, the electric cable 6-3 is a cable connected to a neutral connection N of the polyphase circuit $C_j$.

The remaining additional electric cables that are not connected to the neutral connection of the electricity generator 4 act as spare cables for use in the event of a failure of the polyphase circuit, as described in detail below.

Still in accordance with the invention, all of the n electric cables 6-1, 6-2, ..., 6-n of the electrical installation are connected at the pipeline head to a single connection ring (not shown in FIG. 1), which ring is arranged around the fluid transport pipe and forms a point at zero electric potential.

Furthermore, the n electric cables of the electrical installation may also be connected to ground, as represented by the connection M in FIG. 1.

FIGS. 2 to 5 show an embodiment of the electrical installation of the invention as described above for electrically trace heating an undersea pipe 8 for transporting hydrocarbons (in this example the pipe is made of steel).

In this embodiment, the electrical installation of the electrical heat-tracing system comprises ten (round or flat) electric cables 6-1, 6-2, ..., 6-10 that are positioned around the pipe 8 between its two longitudinal ends so as to be regularly distributed around its longitudinal axis X-X. These electric cables are typically adhesively bonded onto the outside surface of the pipe, and they may be arranged helically around the longitudinal axis X-X of the pipe.

The composition of these electric cables is known to the person skilled in the art and is therefore not described herein. Regardless of whether they are used as main cables or as additional cables, the electric cables are all of the same composition.

Still in the embodiment of FIGS. 2 to 5, among the ten electric cables of the electrical installation, three electric cables (e.g. the cables 6-1, 6-4, and 6-7) are connected at the pipeline head to the electricity generator (not shown in the figures) in order to form the three phases of a single three-phase circuit (these are the main cables).

The electrical installation thus also has seven additional electric cables, namely the cables 6-2, 6-3, 6-5, 6-6, 6-8, and 6-9, that are distinct from the three electric cables 6-1, 6-4, and 6-7 that are connected to the electricity generator, in order to form the phases of the three-phase circuit.

In other words, in this example the electrical installation has ten electric cables (n=10), three of which are connected at the pipeline head to the electricity generator in order to form a three-phase circuit (p=3), and seven of which are not connected to the line generator.

Thus, with only ten electric cables 6-1 to 6-10, the electrical installation in this embodiment comprises a three-phase circuit that is provided with 600% redundancy, which is generally much greater than required.

The main cables 6-1, 6-4, and 6-7 of the three-phase circuit are in a star connection for conveying electric currents at the same frequency, at the same amplitude, and at different phases. Preferably, the three-phase circuit is balanced, i.e. the currents flowing in the main cables of the circuit or have the same amplitude.

At the pipeline end (remote from the pipeline head), the main electric cables (i.e. the cables 6-1, 6-4, and 6-7) and the additional electric cables (i.e. the cables 6-2, 6-3, 6-5, 6-6, 6-8, and 6-9) are all connected to a single connection ring 10 arranged around the pipe 8 and forming a point at zero electric potential.

Figure 5:
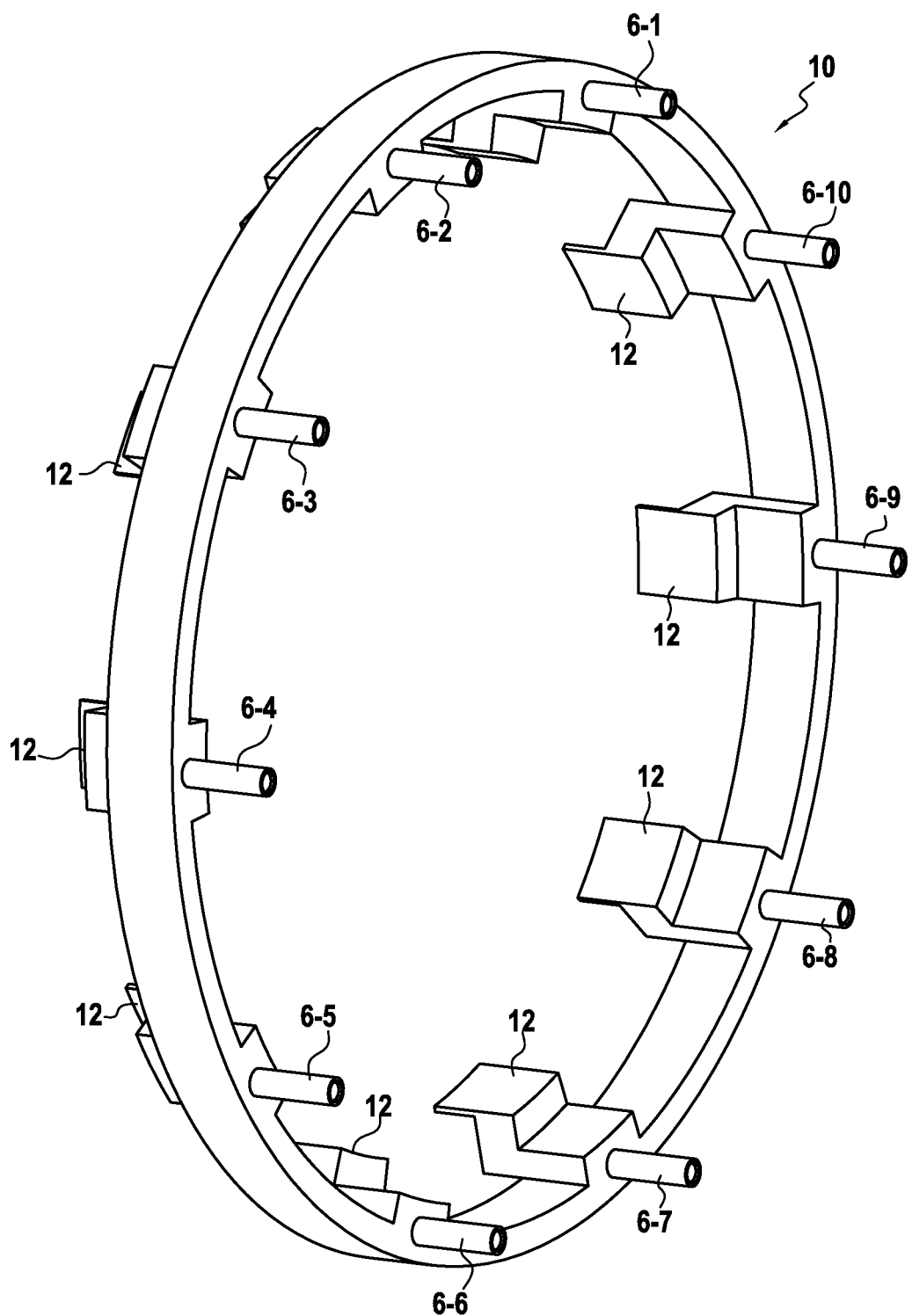
FIG. 5 is a perspective view of the connection ring of the electrical installation of figures to 4.

As shown more precisely in FIG. 5, and by way of example, this connection ring 10 is a metal ring that is centered on the longitudinal axis X-X of the pipe and that is electrically connected to the ends of the main cables and of the additional cables that are remote from the pipeline head (i.e. their ends remote from their ends connected to the electricity generator 4). The shape of the connection ring 10 may vary as a function of the shape of the pipe: it may be circular, cylindrical, square, etc.

Furthermore, in the embodiment of FIGS. 2 to 5, the connection ring 10 has a plurality of tongues 12 for putting the connection ring into electrical contact with the steel pipe 8. For example, there may be as many tongues 12 as there are cables in the electrical installation, and they may be distributed regularly around the longitudinal axis X-X of the pipe. When such tongues are present, provision is advantageously made to install an annular clamping band 14 for clamping the tongues 12 of the connection ring against the pipe.

Nevertheless, it is not essential for the pipe 8 to be electrically connected to the connection ring 10, and if it is not connected, provision is made to arrange an insulating gasket (not shown in the figures) between the connection ring and the pipe.

The electrical installation of the invention further comprises means 16 (FIG. 1) for detecting a failure, if any, of the polyphase circuit $C_j$ in order to identify which main cable (i.e. which one of the cables 6-1, 6-4, and 6-7 in the embodiment of FIGS. 2 to 5) has failed, leading to the failure of the polyphase circuit, and for replacing it with one of the additional cables (i.e. one of the cables 6-2, 6-3, 6-5, 6-6, 6-8, and 6-9 in the embodiment of FIGS. 2 to 5).

Preferably, these means 16 comprise conventional means for monitoring the magnitudes of the electric currents flowing in each of the main cables of the polyphase circuit. This monitoring is commonly performed in electrical installations for trace heating a fluid transport pipe in order to verify continuously that the electric circuits of the installation are operating properly.

Typically, such monitoring means 16 comprise a polyphase circuit analyzer with current measuring loops for determining, for each of the phases and for each neutral connection of the polyphase circuit, the voltages and the magnitudes of the currents, the powers being consumed (active power, reactive power, and overall power), and the phase angle between the voltage and current. These means also include an ohmmeter.

As described above, one or more additional cables of the polyphase circuit $C_j$ of the electrical installation of the invention may be connected to a neutral connection N of said polyphase circuit. This or these additional cables thus constitute neutral conductors of the polyphase circuit.

When the polyphase circuit $C_j$ is balanced (i.e. when the currents flowing in the main cables of the circuit have the same amplitude), the electric current flowing in the neutral connection of the circuit $C_j$ is practically zero (and less than 1% of the current flowing via the main cables). Thus, this solution of connecting the additional cable(s) of the circuit to a neutral connection presents the advantage of being able to detect a failure, if any, of the polyphase circuit by monitoring the magnitude(s) of the current(s) flowing in this or these additional cables: under such circumstances, in the event of the polyphase circuit failing, the magnitude of the current flowing in an additional cable will increase substantially.

In this embodiment, the means for detecting a failure, if any, of the polyphase circuit then comprise means for monitoring the magnitude(s) of the electric current(s) flowing in the additional cable(s) connected to the neutral connection of the polyphase circuit. These monitoring means are identical to those described above.

In another embodiment, the additional cable(s) of the polyphase circuit $C_j$ of the installation of the invention are electrically disconnected from the polyphase circuit (in particular they are not connected to the neutral of the circuit). This or these additional cables thus constitute spare cables for the polyphase circuit.

In this embodiment, the means for detecting a failure, if any, of the polyphase circuit are constituted by the means for monitoring the magnitude of the electric current flowing in each of the main cables of the polyphase circuit, as described above.

The operation of the electrical installation of the invention is as follows.

When the additional cable(s) of each polyphase circuit of the electrical installation is/are connected to the neutral connection of the polyphase circuit, the magnitude(s) of the electric current(s) flowing in this or these additional cable(s) is/are monitored continuously. As soon as the magnitude of the current in any one of these additional cables increases substantially, the operator in charge of monitoring is warned of a failure in the polyphase circuit in question. In order to discover which main cable has failed, thereby giving rise to the failure of the polyphase circuit, the operator monitors the current flowing in each of the main cables in order to verify proper operation thereof. Once the failed main cable has been identified (cable at excess voltage or cable that is disconnected), the operator disconnects the polyphase circuit and replaces the failed main cable with one of the additional cables prior to reconnecting the circuit. This replacement operation is performed merely by connecting the additional cable to the electricity generator (and in particular without any need to remove the failed main cable).

When the additional cable(s) of each polyphase circuit of the electrical installation is/are electrically disconnected from the polyphase circuit, the magnitudes of the electric currents flowing in the main cables constituting the polyphase circuit are monitored continuously. As soon as the magnitude of the current in any one of these main cables increases substantially, the operator in charge of monitoring is warned of a failure of the polyphase circuit in question, disconnects the circuit, and then, as mentioned above, replaces the failed main cable that has given rise to the failure with one of the additional cables, prior to reconnecting the circuit.

It should be observed that when the failure of a main cable of the polyphase circuit constitutes a connection to ground at any point along the cable, the portion of the cable connecting the failure to the electricity generator is still in operation. If the position of the failure (grounding) is situated in the proximity of the connection ring, the loss of effectiveness of the cable is proportional to the ratio of the length of the failed portion divided by the total length of the cable, such that this cable might optionally be usable as a spare cable of last resort (even though it is recommended to scrap it). The position of the failure can easily be determined by comparing the magnitude of the current flowing in the cable with the initial magnitude.

It should also be observed that it is possible to evaluate the resistance of an additional cable of the polyphase circuit (and thus its suitability for acting as a spare cable) by connecting it to the neutral connection of the polyphase circuit. Specifically, when connected to the neutral connection, a very small current flows in the cable, thus enabling its resistance to be measured, from which it is possible to deduce its suitability over its lifetime for serving as a spare cable.

It should also be observed that the electrical installation of the invention may have a plurality of different polyphase circuits, in which case some of the n electric cables are connected at the pipeline head to other electricity generators delivering different powers.

For example, an electrical installation could have a first three-phase circuit powered at a voltage of 5 kilovolts (kV) and a second three-phase circuit powered at a voltage of 7 kV. Under such circumstances, the various polyphase circuits are connected at the pipeline end to the same connection ring forming the point of zero electric potential.

The electrical installation of the invention for the electrical heat-tracing system is described above in association with an undersea pipe of the "single" pipe type, i.e. comprising only one tube in direct contact with the surrounding water and having the hydrocarbons for transporting flowing inside it.

Naturally, the invention applies equally well to undersea pipes of the pipe-in-pipe (PIP) type, i.e. pipes comprising an inner tube made of steel having the hydrocarbons for transporting flowing inside it, and an outer tube made of steel arranged coaxially around the inner tube and in direct contact with the surrounding water. In such an application to pipes of the PIP type, the electric cables of the polyphase circuits of the installation of the electrical system for heat-tracing are positioned around the inner tubes of such pipes.

The invention claimed is:

1. An electrical installation an electrical system for trace heating a fluid transport pipe made of metal, the installation comprising at least one polyphase electric circuit ($C_j$) having:
    at least three main electric cables in a star connection for conveying electric currents having the same frequency, the same amplitude, and different phases;
    at least one additional electric cable distinct from the main cables, the main cables and the additional cable of the polyphase circuit being for positioning around the pipe between two longitudinal ends thereof, and being connected at the pipeline end to a common connection ring arranged around the pipe and forming a point of zero electric potential; and
    detection means for detecting a failure, if any, of the polyphase circuit in order to identify the failed main cable that has given rise to the failure of the polyphase circuit and in order to replace it with the additional cable.

2. The installation according to claim 1, wherein the additional cable of the polyphase circuit is connected to a neutral connection (N) of said polyphase circuit, the means for detecting a failure, if any, of the polyphase circuit comprising means for monitoring the magnitude of the electric current flowing in the additional cable connected to the neutral connection of the polyphase circuit.

3. The installation according to claim 1, wherein the additional cable of the polyphase circuit is a spare cable that is electrically disconnected from the polyphase circuit.

4. The installation according to claim 1, wherein the means for detecting a failure, if any, of the polyphase circuit comprise means for monitoring the magnitude of the electric current flowing in each of the main cables of the polyphase circuit.

5. The installation according to claim 1, wherein the connection ring is electrically connected to the pipeline end of the pipe.

6. The installation according to claim 5, wherein the connection ring includes a plurality of tongues in electrical contact with the pipe, the installation further comprising an annular clamping band for clamping the tongues against said pipe.

7. The installation according to claim 1, wherein the pipe is connected to a neutral connection (N) of the polyphase circuit.

8. The installation according to claim 1, wherein the polyphase circuit is a balanced three-phase circuit in a star connection.

9. A system for electrically heating a fluid transport pipe made of metal, the system comprising an electrical installation according to claim 1 and at least one electricity generator for electrically powering the main cables of the polyphase circuit.

10. A method of electrically trace heating a fluid transport pipe made of metal, the method comprising:
- positioning around the pipe between two longitudinal ends thereof at least three main electric cables that are star connected to form a polyphase circuit, and also at least one additional electric cable;
- coupling the main cables at the pipeline head to an electricity generator;
- coupling the main cables and the additional cable at the pipeline end to a common connection ring arranged around the pipe and forming a point of zero electric potential; and
- detecting any failure of the polyphase circuit in order to identify the failed main cable that has given rise to the failure of the polyphase circuit, and, where appropriate, replacing the failed main cable with the additional cable.

11. The method according to claim 10, wherein the additional cable of the polyphase circuit is connected to a neutral connection (N) of said polyphase circuit, a failure, if any, of the polyphase circuit being detected by means for monitoring the magnitude of the electric current flowing in the additional cable and forming a neutral conductor of the polyphase circuit.

12. The method according to claim 10, wherein the additional cable of the polyphase circuit is a spare cable that is electrically disconnected from said polyphase circuit, detection of a failure, if any, of the polyphase circuit comprising monitoring the magnitude of the electric current flowing in each of the main cables of the polyphase circuit.

13. The method according to claim 10, further comprising electrically connecting the pipe at the pipeline end to the connection ring.

* * * * *